United States Patent
Lin et al.

(10) Patent No.: US 11,194,204 B2
(45) Date of Patent: Dec. 7, 2021

(54) PIXEL ARRAY SUBSTRATE

(71) Applicant: Au Optronics Corporation, Hsinchu (TW)

(72) Inventors: Hung-Che Lin, Hsinchu (TW); Min-Tse Lee, Hsinchu (TW); Yi-Ren Chen, Hsinchu (TW); Yueh-Hung Chung, Hsinchu (TW); Sheng-Ju Ho, Hsinchu (TW); Yan-Kai Wang, Hsinchu (TW); Ya-Ling Hsu, Hsinchu (TW); Chien-Huang Liao, Hsinchu (TW); Chen-Hsien Liao, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 117 days.

(21) Appl. No.: 16/843,901

(22) Filed: Apr. 9, 2020

(65) Prior Publication Data

US 2021/0116764 A1   Apr. 22, 2021

(30) Foreign Application Priority Data

Oct. 17, 2019 (TW) .................................. 108137537

(51) Int. Cl.
*G02F 1/1362* (2006.01)
*G02F 1/1333* (2006.01)
(Continued)

(52) U.S. Cl.
CPC ...... *G02F 1/136286* (2013.01); *G02F 1/1368* (2013.01); *G02F 1/133345* (2013.01);
(Continued)

(58) Field of Classification Search
None
See application file for complete search history.

(56) References Cited

U.S. PATENT DOCUMENTS 8,542,161 B2   9/2013   Chiang et al.
9,423,660 B2   8/2016   Huang et al.
(Continued)

FOREIGN PATENT DOCUMENTS

| CN | 107544188 | 1/2018 |
|---|---|---|
| CN | 109634012 | 4/2019 |
| JP | 2001174842 | 6/2001 |

*Primary Examiner* — James A Dudek
(74) *Attorney, Agent, or Firm* — JCIPRNET (57) ABSTRACT

A pixel array substrate including a substrate, pixel structures, and transfer lines is provided. The pixel structures are disposed on the substrate. Each pixel structure includes a data line, a gate line, an active device, and a pixel electrode. The active device is electrically connected to the data line and the gate line. The pixel electrode is electrically connected to the active device. The pixel electrode defines alignment domains. The alignment domains have different alignment directions. The transfer lines are arranged in a first direction. Gate lines of the pixel structures are arranged in a second direction. The first direction and the second direction are interlaced. The transfer lines are electrically connected to the gate lines. The pixel structures include a first pixel structure. The transfer lines include a first transfer line. The first transfer line overlaps a boundary between the alignment domains of the first pixel structure.

20 Claims, 8 Drawing Sheets

(51) Int. Cl.
*G02F 1/1368* (2006.01)
*H01L 27/12* (2006.01)
(52) U.S. Cl.
CPC ...... *H01L 27/124* (2013.01); *G02F 2201/121* (2013.01); *G02F 2201/123* (2013.01)

(56) References Cited

U.S. PATENT DOCUMENTS

2010/0188378 A1* 7/2010 Chiang ................ G09G 3/3648
  345/206
2016/0195788 A1* 7/2016 Bae ................... G02F 1/136286
  257/72

* cited by examiner

PIXEL ARRAY SUBSTRATE

CROSS-REFERENCE TO RELATED APPLICATION

This application claims the priority benefit of Taiwan patent application serial no. 108137537, filed on Oct. 17, 2019. The entirety of the above-mentioned patent application is hereby incorporated by reference here and made a part of this specification.

BACKGROUND OF THE INVENTION

1. Field of the Invention

The invention relates to a pixel array substrate.

2. Description of Related Art

With development of display technologies, in addition to optical property requirements such as high resolution, high contrast, wide viewing angles on display devices, people further expect the display devices to have elegant appearances. For example, people expect the display devices to have narrow frames or even no frames.

Usually, a display device includes a pixel array disposed in a display region, a data driver circuit disposed below a display region, and at least one gate driver circuit disposed on a left side, a right side, or both the left side and the right side of the display region. To reduce widths of frames on the left side and the right side of the display device, both the gate driver circuit and the data driver circuit may be disposed on a lower side of the display region. When the gate driver circuit is disposed on the lower side of the display region, a gate line extending in a horizontal direction needs to be electrically connected to the gate driver circuit through a transfer line extending in a vertical direction. However, the transfer line needs to occupy a layout area of the display region, causing more lines disposed in the display region, and affecting an aperture ratio of a pixel array substrate.

SUMMARY OF THE INVENTION

The invention provides a pixel array substrate, which has a high aperture ratio.

The invention provides another pixel array substrate, which has a high aperture ratio and can be patched.

A pixel array substrate of an embodiment of the invention includes a substrate, a plurality of pixel structures, and a plurality of transfer lines. The plurality of pixel structures are disposed on the substrate, where each of the pixel structures includes a data line, a gate line, an active device, and a pixel electrode, the active device is electrically connected to the data line and the gate line, the pixel electrode is electrically connected to the active device, the pixel electrode defines a plurality of alignment domains, and the alignment domains include a plurality of different alignment directions. The plurality of transfer lines are arranged in a first direction, a plurality of gate lines of the plurality of pixel structures are arranged in a second direction, the first direction and the second direction are interlaced, and the plurality of transfer lines are electrically connected to the plurality of gate lines. The plurality of pixel structures include a first pixel structure, the plurality of transfer lines includes a first transfer line, and the first transfer line overlaps a boundary between the plurality of alignment domains of the first pixel structure.

In an embodiment of the invention, the pixel electrode of each of the pixel structures includes a first trunk portion and a plurality of branch portions, and the first trunk portion extends in the second direction; the plurality of branch portions are respectively located on two opposite sides of the first trunk portion and extend toward different directions; and the first transfer line overlaps the first trunk portion of the pixel electrode of the first pixel structure.

In an embodiment of the invention, each of the pixel structures further includes a conductive pattern, the conductive pattern partially overlaps the pixel electrode, at least one part of the conductive pattern is a common electrode, and the pixel array substrate further includes: a patching line, disposed on the substrate, and separate from the common electrode in structure, where the plurality of pixel structures further include a second pixel structure, and the patching line overlaps a boundary between the plurality of alignment domains of the second pixel structure.

In an embodiment of the invention, the pixel electrode of each of the pixel structures includes a first trunk portion and a plurality of branch portions, and the first trunk portion extends in the second direction; the plurality of branch portions are respectively located on two opposite sides of the first trunk portion and extend toward different directions; and the patching line overlaps the first trunk portion of the pixel electrode of the second pixel structure.

In an embodiment of the invention, the conductive pattern of each of the pixel structures includes a first portion extending in the first direction and at least one second portion extending in the second direction; and the first portion of the conductive pattern of the second pixel structure and the patching line are interlaced.

In an embodiment of the invention, the pixel electrode of each of the pixel structures includes a first trunk portion and a second trunk portion interlaced with each other; and an intersection between the first portion of the conductive pattern of the second pixel structure and the patching line overlaps an intersection between the first trunk portion and the second trunk portion of the second pixel structure.

In an embodiment of the invention, the plurality of pixel structures further include a third pixel structure, the first pixel structure and the second pixel structure are arranged in the first direction, and the second pixel structure and the third pixel structure are arranged in the second direction; and at least one break position exists between the first portion and the at least one second portion of the conductive pattern of the second pixel structure, a connection point exists between the first portion of the conductive pattern of the second pixel structure and the patching line, at least one break position exists between the first portion and the at least one second portion of the conductive pattern of the third pixel structure, and a connection point exists between the first portion of the conductive pattern of the third pixel structure and the patching line.

In an embodiment of the invention, the plurality of pixel structures further include a fourth pixel structure, the first pixel structure and the fourth pixel structure are arranged in the second direction, and the third pixel structure and the fourth pixel structure are arranged in the first direction; the data line of the fourth pixel structure includes an opening, and the data line of the fourth pixel structure is divided into a first part and a second part by the opening; at least one break position exists between the first portion and the at least one second portion of the conductive pattern of the first pixel structure; a connection point exists between the first part of the data line of the fourth pixel structure and the first portion of the conductive pattern of the first pixel structure; the first portion of the conductive pattern of the first pixel structure is electrically connected to the first portion of the conductive pattern of the second pixel structure; the first portion of the conductive pattern of the third pixel structure is electrically connected to the first portion of the conductive pattern of the fourth pixel structure; and at least one break position exists between the first portion and the at least one second portion of the conductive pattern of the fourth pixel structure, and a connection point exists between the second part of the data line of the fourth pixel structure and the first portion of the conductive pattern of the fourth pixel structure.

In an embodiment of the invention, the data line of the third pixel structure includes an opening, and the data line of the third pixel structure is divided into a first part and a second part by the opening; and a connection point exists between the first part of the data line of the third pixel structure and the first portion of the conductive pattern of the second pixel structure, and a connection point exists between the second part of the data line of the third pixel structure and the first portion of the conductive pattern of the third pixel structure.

A pixel array substrate of an embodiment of the invention includes a substrate, a plurality of pixel structures, a plurality of transfer lines, and a patching line. The plurality of pixel structures are disposed on the substrate, where each of the pixel structures includes a data line, a gate line, an active device, a pixel electrode, and a conductive pattern, the active device is electrically connected to the data line and the gate line, the pixel electrode is electrically connected to the active device, the pixel electrode defines a plurality of alignment domains, the plurality of alignment domains include a plurality of different alignment directions, the conductive pattern partially overlaps the pixel electrode, and at least one part of the conductive pattern is a common electrode. The plurality of transfer lines are arranged in a first direction, a plurality of gate lines of the plurality of pixel structures are arranged in a second direction, the first direction and the second direction are interlaced, and the plurality of transfer lines are electrically connected to the plurality of gate lines. The patching line is disposed on the substrate and is separate from the common electrode in structure, where the plurality of pixel structures include a first pixel structure, and the patching line overlaps a boundary between the plurality of alignment domains of the first pixel structure.

In an embodiment of the invention, the pixel electrode of each of the pixel structures includes a first trunk portion and a plurality of branch portions, and the first trunk portion extends in the second direction; the plurality of branch portions are respectively located on two opposite sides of the first trunk portion and extend toward different directions; and the patching line overlaps the first trunk portion of the pixel electrode of the first pixel structure.

In an embodiment of the invention, the conductive pattern of each of the pixel structures includes a first portion extending in the first direction and at least one second portion extending in the second direction; and the first portion of the conductive pattern of the first pixel structure and the patching line are interlaced.

In an embodiment of the invention, the pixel electrode of each of the pixel structures includes a first trunk portion and a second trunk portion interlaced with each other; and an intersection between the first portion of the conductive pattern of the first pixel structure and the patching line overlaps an intersection between the first trunk portion and the second trunk portion of the first pixel structure.

In an embodiment of the invention, the plurality of pixel structures include a second pixel structure, and the first pixel structure and the second pixel structure are arranged in the second direction; at least one break position exists between the first portion and the at least one second portion of the conductive pattern of the first pixel structure, and a connection point exists between the first portion of the conductive pattern of the first pixel structure and the patching line; and at least one break position exists between the first portion and the at least one second portion of the conductive pattern of the second pixel structure, and a connection point exists between the first portion of the conductive pattern of the second pixel structure and the patching line.

In an embodiment of the invention, the plurality of pixel structures further include a third pixel structure and a fourth pixel structure, the second pixel structure and the third pixel structure are arranged in the first direction, the third pixel structure and the fourth pixel structure are arranged in the second direction, and the first pixel structure and the fourth pixel structure are arranged in the first direction; the data line of the third pixel structure includes an opening, and the data line of the third pixel structure is divided into a first part and a second part by the opening; at least one break position exists between the first portion and the at least one second portion of the conductive pattern of the fourth pixel structure, and a connection point exists between the first part of the data line of the third pixel structure and the first portion of the conductive pattern of the fourth pixel structure; the first portion of the conductive pattern of the fourth pixel structure is electrically connected to the first portion of the conductive pattern of the first pixel structure; the first portion of the conductive pattern of the second pixel structure is electrically connected to the first portion of the conductive pattern of the third pixel structure; and at least one break position exists between the first portion and the at least one second portion of the conductive pattern of the third pixel structure, and a connection point exists between the second part of the data line of the third pixel structure and the first portion of the conductive pattern of the third pixel structure.

In an embodiment of the invention, the data line of the second pixel structure includes an opening, and the data line of the second pixel structure is divided into a first part and a second part by the opening; a connection point exists between the first part of the data line of the second pixel structure and the first portion of the conductive pattern of the first pixel structure; and a connection point exists between the first portion of the conductive pattern of the second pixel structure and the second portion of the data line of the second pixel structure.

In an embodiment of the invention, the plurality of transfer lines include a first transfer line, a second transfer line, a third transfer line, and a fourth transfer line sequentially arranged in the first direction, and the pixel array substrate further includes: an insulation layer, disposed between the plurality of transfer lines and the plurality of gate lines, where the first transfer line, the second transfer line, the third transfer line, and the fourth transfer line are electrically connected to the plurality of gate lines respectively through a first contact window, a second contact window, a third contact window, and a fourth contact window of the insulation layer, and the second contact window and the third contact window are respectively located on two opposite sides of a connecting line between the first contact window and the fourth contact window.

In an embodiment of the invention, the plurality of transfer lines include a first transfer line, a second transfer line, a third transfer line, and a fourth transfer line sequentially arranged in the first direction, the plurality of gate lines include a first gate line, a second gate line, a third gate line, and a fourth gate line sequentially arranged in the second direction, and the pixel array substrate further includes: an insulation layer, disposed between the plurality of transfer lines and the plurality of gate lines, where the first transfer line is electrically connected to the first gate line through a first contact window of the insulation layer, the second transfer line is electrically connected to the third gate line through a second contact window of the insulation layer, the third transfer line is electrically connected to the second gate line through a third contact window of the insulation layer, and the fourth transfer line is electrically connected to the fourth gate line through a fourth contact window of the insulation layer.

DESCRIPTION OF THE EMBODIMENTS

Exemplary embodiments of the invention are described in detail, and examples of the exemplary embodiments are shown in the accompanying drawings. Whenever possible, the same component symbols are used in the drawings and descriptions to indicate the same or similar parts.

It should be understood that when a component such as a layer, film, region or substrate is referred to as being "on" or "connected" to another component, it may be directly on or connected to the another component, or an intermediate component may exist. In contrast, when a component is referred to as being "directly on" or "directly connected to" another component, there is no intermediate component. As used herein, "connection" may refer to a physical and/or an electrical connection. Further, "electrical connection" or "coupling" may mean that there is another component between two components.

As used herein, "about", "approximately", or "substantially" is inclusive of the stated value and means within an acceptable deviation range of the particular value as determined by one of ordinary skills in the art, considering the discussed measurement and a particular quantity of errors associated with the measurement (i.e., the limitations of the measurement system). For example, "about" may mean within one or more standard deviations, or within ±30%, ±20%, ±10%, or ±5% of the stated value. Further, as used herein, "about", "approximately", or "substantially" may be used to select a more acceptable deviation range or standard deviation depending on optical properties, etch properties, or other properties, rather than applying one standard deviation to all properties.

Unless otherwise defined, all terms (including technical and scientific terms) used herein have the same meaning as commonly understood by one of ordinary skills in the art to which the present invention belongs. It will be further understood that terms such as those defined in commonly used dictionaries should be interpreted as having meanings consistent with their meanings in the context of the related art and the present invention and will not be interpreted in an idealized or overly formal sense unless expressly so defined herein.

Figure 1:
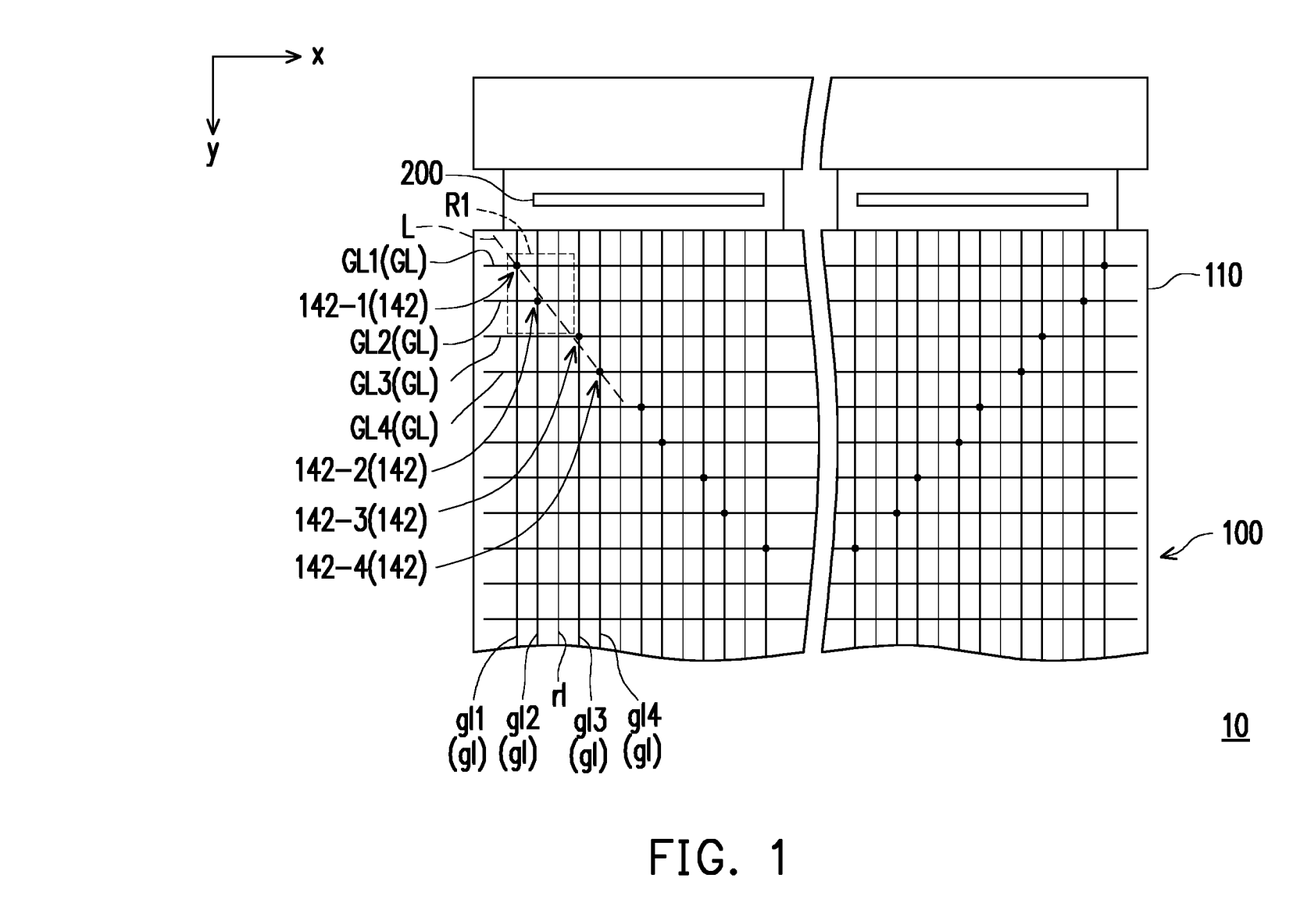
FIG. 1 is a schematic top view of a display device 10 according to an embodiment of the invention.

FIG. 1 is a schematic top view of a display device 10 according to an embodiment of the invention.

FIG. 1 shows a pixel array substrate 100 and a driver element 200 of the display device 10, and other components of the display device 10 are omitted.

Figure 2:
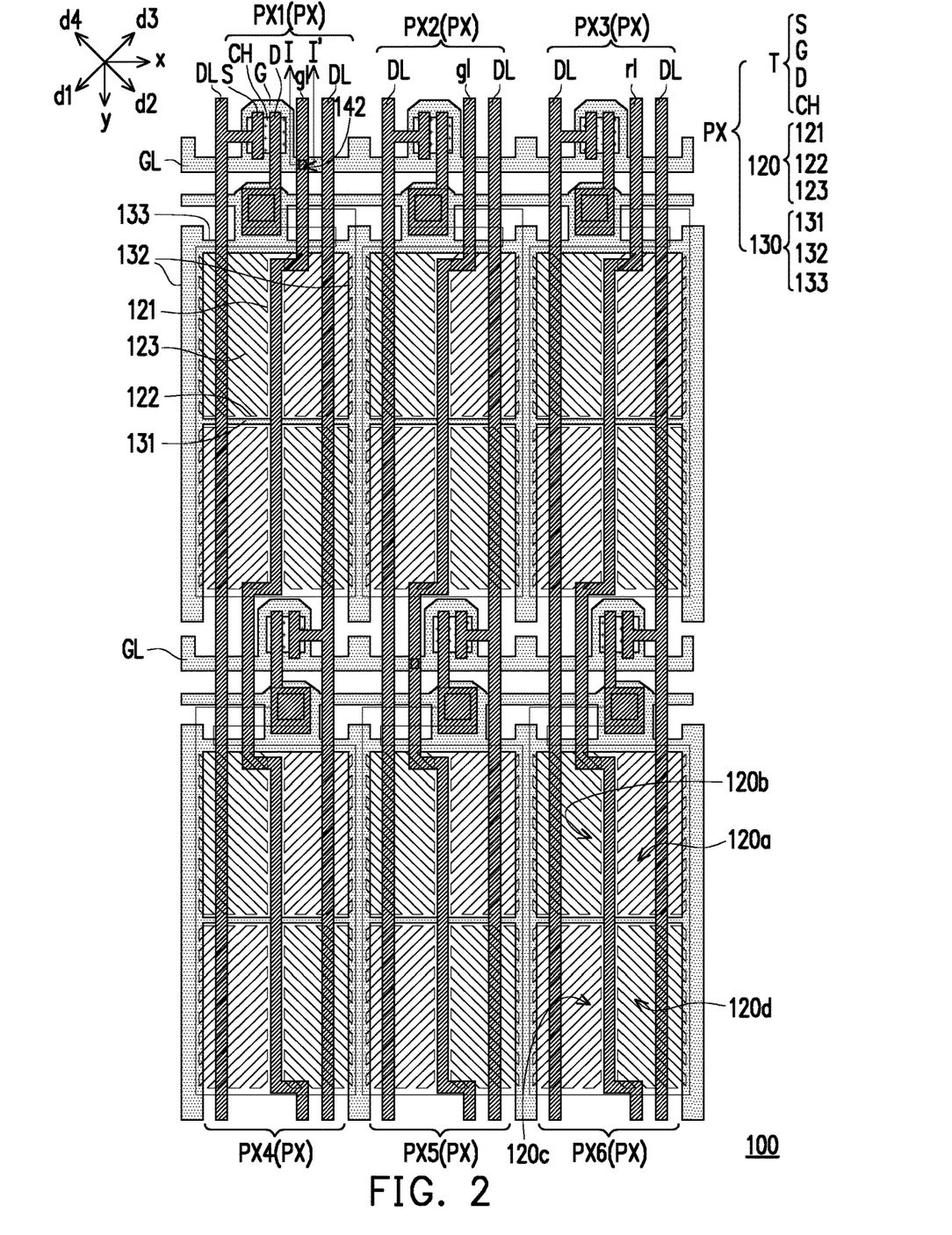
FIG. 2 is a schematic top view of a pixel array substrate 100 according to an embodiment of the invention.

FIG. 2 is a schematic top view of a pixel array substrate 100 according to an embodiment of the invention. FIG. 2 corresponds to a part R1 in FIG. 1.

A plurality of data lines DL, a plurality of active devices T, a plurality of pixel electrodes 120, and a plurality of conductive patterns 130 in FIG. 2 are omitted in FIG. 1, and a substrate 110 in FIG. 1 is omitted in FIG. 2.

Figure 3:
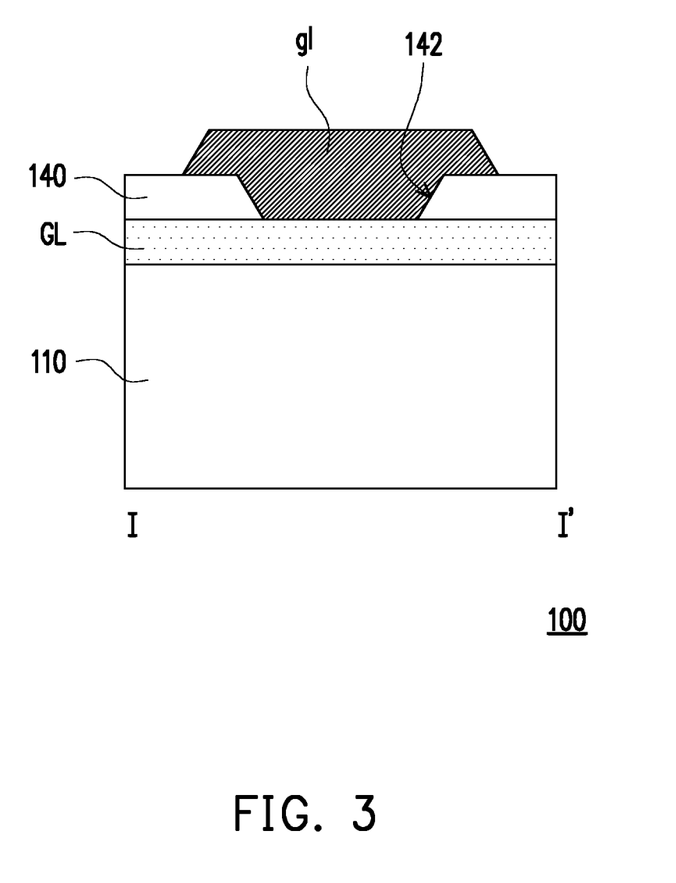
FIG. 3 is a schematic cross-sectional view of a pixel array substrate 100 according to an embodiment of the invention.

FIG. 3 is a schematic cross-sectional view of a pixel array substrate 100 according to an embodiment of the invention. FIG. 3 corresponds to a section line I-I' in FIG. 2.

Referring to FIG. 1 and FIG. 2, the display device 10 includes the pixel array substrate 100, an opposite substrate (not shown) relative to the pixel array substrate 100, a display medium (not shown) disposed between the pixel array substrate 100 and the opposite substrate, and the driver element 200 configured to drive the pixel array substrate 100.

For example, in the present embodiment, the driver element 200 may include a chip, and the chip may bond with the pixel array substrate 100 through a chip on film (COF) process. However, the invention is not limited thereto. According to other embodiments, the chip may alternatively bond with the pixel array substrate 100 through a chip on glass (COG) process or tape automated bonding (TAB), or in other manners.

The pixel array substrate 100 includes a substrate 110. The substrate 110 is mainly configured to carry a plurality of components of the pixel array substrate 100. For example, in the present embodiment, a material of the substrate 110 may be glass. However, the invention is not limited thereto. According to other embodiments, the material of the substrate 110 may alternatively be quartz, organic polymer, or an opaque/reflective material (for example, wafer or ceramics), or other applicable materials.

The pixel array substrate 100 includes a plurality of pixel structures PX, disposed on the substrate 110. Each pixel structure PX includes a data line DL, a gate line GL, an active device T, and a pixel electrode 120, where the active device T is electrically connected to the data line DL and the gate line GL, and the pixel electrode 120 is electrically connected to the active device T. The plurality of data lines DL of the plurality of pixel structures PX are arranged in a first direction x, and the plurality of gate lines GL of the plurality of pixel structures PX are arranged in a second direction y, where the first direction x and the second direction y are interlaced.

For example, in the present embodiment, the active device T may include a thin film transistor, the thin film transistor includes a source S, a drain D, a gate G, and a semiconductor pattern CH, the source S and the drain D are respectively electrically connected to two different regions of the semiconductor pattern CH, the source S is electrically connected to the data line DL, the gate G is electrically connected to the gate line GL, and the drain D is electrically connected to the pixel electrode 120.

In the present embodiment, the gate line GL and the gate G may selectively belong to a first metal layer, and the data line DL, the source S, and the drain D may selectively belong to a second metal layer, but the invention is not limited thereto.

The pixel electrode 120 defines a plurality of alignment domains 120a, 120b, 120c, and 120d, and the plurality of alignment domains 120a, 120b, 120c, and 120d have a plurality of different alignment directions d1, d2, d3, and d4.

For example, in the present embodiment, the pixel electrode 120 of the pixel structure PX may include a first trunk portion 121, a second trunk portion 122, and a plurality of branch portions 123. The first trunk portion 121 extends in the second direction y. The second trunk portion 122 extends in the first direction x. The first trunk portion 121 and the second trunk portion 122 are interlaced. The plurality of branch portions 123 are connected to the first trunk portion 121 and the second trunk portion 122. The plurality of branch portions 123 are respectively located on two opposite sides of the first trunk portion 121 and two opposite sides of the second trunk portion 122, and extend toward different directions, to define the plurality of alignment domains 120a, 120b, 120c, and 120d including the different alignment directions d1, d2, d3, and d4. However, the invention is not limited thereto. According to other embodiments, the pixel electrode 120 may alternatively be other patterns, and a quantity of the alignment domains 120a, 120b, 120c, and 120d defined by the pixel electrode 120 is not limited to four.

In the present embodiment, the pixel electrode 120 may belong to a transparent conductive layer, which includes a metal oxide, for example, an indium tin oxide, an indium zinc oxide, an aluminum tin oxide, an aluminum zinc oxide, an indium germanium zinc oxide, other suitable oxides, or a stack layer of at least two of the above, but the invention is not limited thereto.

In the present embodiment, the pixel structure PX further includes a conductive pattern 130, the conductive pattern 130 partially overlaps the pixel electrode 120, at least one part of the conductive pattern 130 is a common electrode, and the common electrode and the pixel electrode 120 form a storage capacitor of the pixel structure PX.

For example, in the present embodiment, the conductive pattern 130 of the pixel structure PX includes a first portion 131, at least one second portion 132, and a third portion 133. The first portion 131 extends in the first direction x. The at least one second portion 132 extends in the second direction y. The third portion 133 extends in the first direction x and is separate from the first portion 131, and the third portion 133 is interlaced with and is connected to the at least one second portion 132. A plurality of third portions 133 of a plurality of conductive patterns 130 of a plurality of pixel structures PX in a same row are connected.

In the present embodiment, the first portion 131 of the conductive pattern 130 may overlap the second trunk portion 122 of the pixel electrode 120, the conductive pattern 130 may include a plurality of second portions 132, the plurality of second portions 132 may respectively overlap both left and right edges of the pixel electrode 120, and the third portion 133 of the conductive pattern 130 may overlap an upper edge of the pixel electrode 120. However, the invention is not limited thereto. According to other embodiments, the conductive pattern 130 may alternatively be other patterns.

Referring to FIG. 2, when the pixel structure PX does not need to be patched or is not patched, the first portion 131, the at least one second portion 132, and the third portion 133 of the conductive pattern 130 of the pixel structure PX are connected to one another, and the entire conductive pattern 130 (including the first portion 131, the at least one second portion 132, and the third portion 133) of the pixel structure PX is a common electrode. For example, in the present embodiment, the conductive pattern 130 may selectively belong to a first metal layer, but the invention is not limited thereto.

Referring to FIG. 1 and FIG. 2, the pixel array substrate 100 includes a plurality of transfer lines gl, disposed on the substrate 110. The plurality of transfer lines gl are arranged in the first direction x. The plurality of transfer lines gl arranged in the first direction x are respectively electrically connected to the plurality of gate lines GL arranged in the second direction y.

Referring to FIG. 1, FIG. 2 and FIG. 3, for example, in the present embodiment, the plurality of gate lines GL may selectively belong to the first metal layer, the plurality of transfer lines gl may selectively belong to the second metal layer, and the insulation layer 140 is provided between the first metal layer and the second metal layer. The insulation layer 140 includes a plurality of contact windows 142, the plurality of transfer lines gl may be electrically connected to the plurality of gate lines GL through the plurality of contact windows 142 of the insulation layer 140, but the invention is not limited thereto.

Referring to FIG. 1, the plurality of transfer lines gl include a first transfer line gl1, a second transfer line gl2, a third transfer line gl3, and a fourth transfer line gl4 that are sequentially arranged in the first direction x, and the plurality of gate lines GL include a first gate line GL1, a second gate line GL2, a third gate line GL3, and a fourth gate line GL4 that are sequentially arranged in the second direction y. In the present embodiment, the first transfer line gl1, the second transfer line gl2, the third transfer line gl3, and the fourth transfer line gl4 are electrically connected to the first gate line GL1, the second gate line GL2, the third gate line GL3, and the fourth gate line GL4 respectively through a first contact window 142-1, a second contact window 142-2, a third contact window 142-3, and a fourth contact window 142-4 of the insulation layer 140 (shown in FIG. 3), but the invention is not limited thereto.

For example, in the present embodiment, a connecting line L exists between the first contact window 142-1 and the fourth contact window 142-4, and the second contact window 142-2 and the third contact window 142-3 are essentially located on the connecting line L. In other words, in the present embodiment, a plurality of contact windows 142 located on a same side (for example: a half left side or a half right side) of the substrate 110 are approximately arranged along an oblique line. However, the invention is not limited thereto. According to other embodiments, the plurality of contact windows 142 may alternatively be arranged in other manners.

Referring to FIG. 1 and FIG. 2, in the present embodiment, the source driver circuit electrically connected to the plurality of data lines DL is disposed on a first side (for example: an upper side) of the substrate 110, and the plurality of gate lines GL are electrically connected, through the plurality of transfer lines gl, to the gate driver circuit disposed on the first side (for example: the upper side) of the substrate 110. In other words, in the present embodiment, the source driver circuit and the gate driver circuit are disposed on the same side of the substrate 110, and lines for connecting the gate line GL and the gate driver circuit do not need to be disposed on other sides (for example: a left side, a right side, and a lower side) of the substrate 110, thereby making other sides of the display device 10 have ultra-narrow frames or even no frames. In the present embodiment, the source driver circuit and the gate driver circuit may be selectively integrated into a same driver element 200 (for example: a chip), but the invention is not limited thereto.

Referring to FIG. 2, it should be noted that, a transfer line gl overlaps a boundary between a plurality of alignment domains 120a and 120b of at least one pixel structure PX. Display mediums (for example: a plurality of liquid crystal molecules) of the display device 10 are different in the alignment directions d1 and d2 of the plurality of alignment domains 120a and 120b, and a disclination line is formed on a boundary between the plurality of alignment domains 120a and 120b for the display device 10. The transfer line gl is disposed on the disclination line, so that impact of the disposition of the transfer line gl on an aperture ratio of the pixel array substrate 100 can be reduced. In other words, the pixel array substrate 100 can still have a high aperture ratio when the pixel array substrate 100 is enabled to have ultra-narrow frames or even no frames through disposition of a plurality of transfer lines gl on an active area.

For example, in the present embodiment, a plurality of pixel structures PX in a same column are arranged in the second direction y, and each transfer line gl may overlap a plurality of first trunk portions 121 of a plurality of pixel electrodes 120 of the plurality of pixel structures PX in the same column, but the invention is not limited thereto.

Referring to FIG. 1 and FIG. 2, in the present embodiment, the pixel array substrate 100 may further include a patching line rl. The patching line rl is disposed on a substrate 110 and is separate from the common electrode of the conductive pattern 130 in structure.

Referring to FIG. 2, when a pixel structure PX does not need to be patched or is not patched, the entire conductive pattern 130 (including the first portion 131, the at least one second portion 132, and the third portion 133) of the pixel structure PX is used as the common electrode, and the patching line rl is separate from the entire conductive pattern 130 in structure. When the pixel structure PX does not need to be patched or is not patched, and the entire conductive pattern 130 of the pixel structure PX is used as the common electrode, the patching line rl and the conductive pattern 130 may have different potentials. For example, in the present embodiment, the conductive pattern 130 has a common potential (for example, but not limited to: 5 V to 6 V), and the patching line rl may include a gate-off potential, where the gate-off potential can enable the thin film transistor of the active device T to be in an off state, and the gate-off potential is, for example, but not limited to, −9V. However, the invention is not limited thereto. In other embodiments, when the pixel structure PX does not need to be patched or is not patched, the patching line rl may alternatively have other potentials.

Referring to FIG. 2, it should be noted that, the transfer line gl and the patching line rl respectively overlap boundaries between a plurality of alignment domains 120a and 120b of different pixel structures PX. For example, in the present embodiment, a pixel structure PX1 and a pixel structure PX3 are arranged in the first direction x, and the transfer line gl and the patching line rl may respectively overlap a boundary between a plurality of alignment domains 120a and 120b of the pixel structure PX1 and a boundary between a plurality of alignment domains 120a and 120b of the pixel structure PX3. Similarly, display mediums (for example: a plurality of liquid crystal molecules) of the display device 10 are different in the alignment directions d1 and d2 of the plurality of alignment domains 120a and 120b, and a disclination line is formed on a boundary between the plurality of alignment domains 120a and 120b for the display device 10. The patching line rl is disposed on the disclination line, so that impact of the disposition of the patching line rl on the aperture ratio of the pixel array substrate 100 can be reduced. In other words, the pixel array substrate 100 can still have a high aperture ratio while the pixel array substrate 100 can patch the data line DL with an opening O (shown in FIG. 4, FIG. 5, and FIG. 6) by using the patching line rl.

In the present embodiment, the patching line rl and the first portion 131 of the conductive pattern 130 of at least one pixel structure PX are interlaced. For example, in the present embodiment, an intersection between the first portion 131 of the conductive pattern 130 of the at least one pixel structure PX and the patching line rl may overlap an intersection between the first trunk portion 121 of the pixel electrode 120 of the pixel structure PX and the second trunk portion 122, but the invention is not limited thereto.

Referring to FIG. 2, for example, in the present embodiment, the plurality of pixel structures PX include a plurality of pixel structures PX1, PX2, PX3, PX4, PX5, and PX6 that are arranged in arrays. A plurality of pixel structures PX1, PX2, and PX3 are arranged in a first row in the first direction x. A plurality of pixel structures PX4, PX5, and PX6 are arranged in a second row in the first direction x. A plurality of pixel structures PX1 and PX4 are arranged in a first column in the second direction y. A plurality of pixel structures PX2 and PX5 are arranged in a second column in the second direction y. A plurality of pixel structures PX3 and PX6 are arranged in a third column in the second direction y. One transfer line gl may overlap a plurality of first trunk portions 121 of a plurality of pixel electrodes 120 of the plurality of pixel structures PX1 and PX4 in the first column. Another transfer line gl may overlap a plurality of first trunk portions 121 of a plurality of pixel electrodes 120 of the plurality of pixel structures PX2 and PX5 in the second column. The patching line rl may overlap a plurality of first trunk portions 121 of a plurality of pixel electrodes 120 of the plurality of pixel structures PX3 and PX6 in the third column. The patching line rl may interlace with a plurality of first portions 131 of a plurality of conductive patterns 130 of the plurality of pixel structures PX3 and PX6 in the third column. A plurality of intersections between the first portions 131 of the plurality of conductive patterns 130 of the plurality of pixel structures PX3 and PX6 in the third column and the patching line rl may overlap a plurality of intersections between the plurality of first trunk portions 121 of the plurality of pixel electrodes 120 of the plurality of pixel structures PX3 and PX6 and a plurality of second trunk portions 122. However, the invention is not limited thereto.

It should be noted herein that, the following embodiments follow reference numerals and partial content of the foregoing embodiments. Same numerals are used to represent same or similar elements, and descriptions of same technical content are omitted. For the descriptions of the omitted part, refer to the foregoing embodiments. Details thereof are omitted in the following embodiments.

Figure 4:
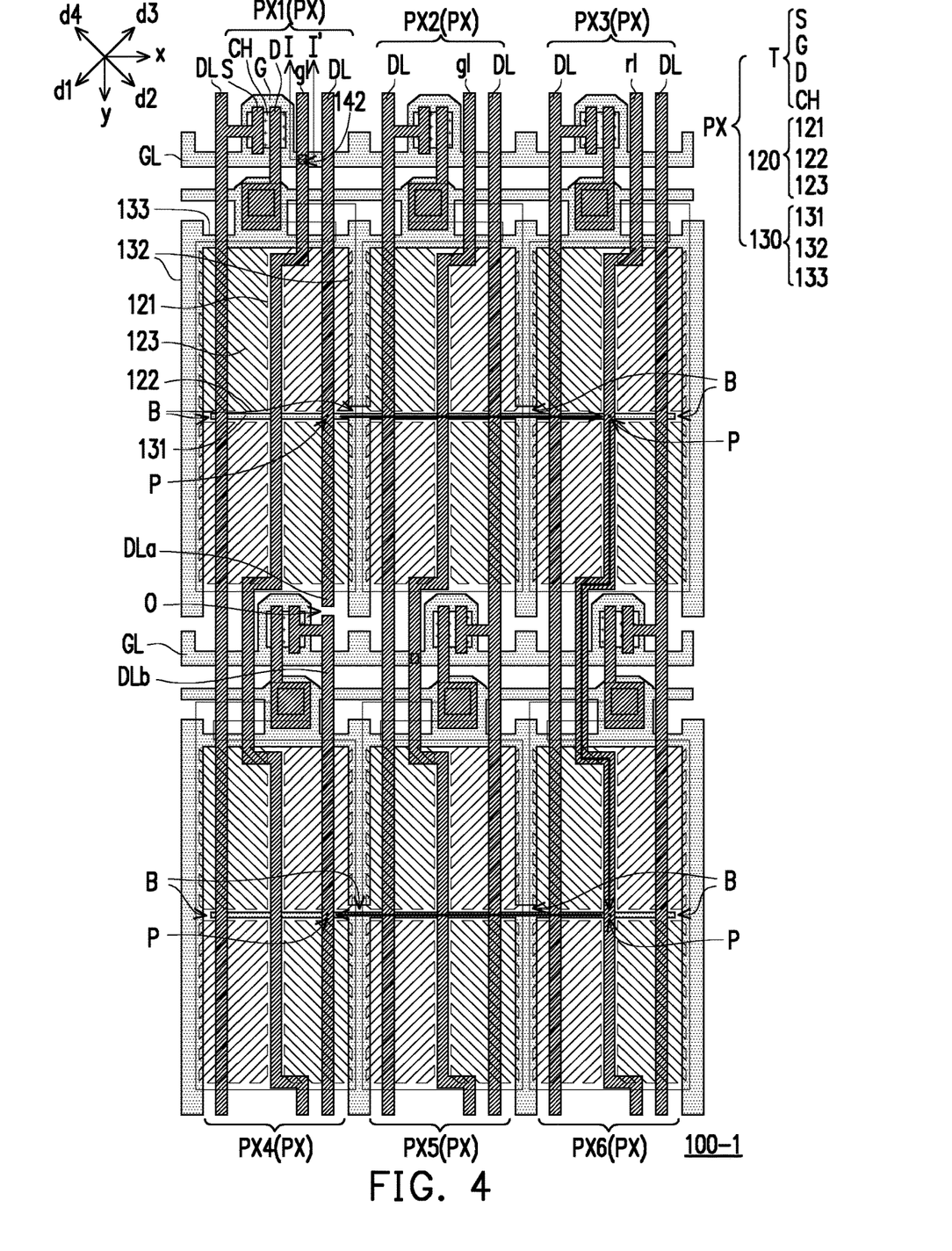
FIG. 4 shows a patched pixel array substrate 100-1 according to an embodiment of the invention.

FIG. 4 shows a patched pixel array substrate 100-1 according to an embodiment of the invention. The pixel array substrate 100-1 in FIG. 4 is similar to the pixel array substrate 100 in FIG. 2, and a difference between the two lies in that: a data line DL of a pixel structure PX4 in FIG. 4 has an opening O, that is, a defect, and the defect is patched.

Referring to FIG. 4, specifically, in the present embodiment, the data line DL of the pixel structure PX4 has the opening O (that is, a defect position), and the opening O divides the data line DL of the pixel structure PX4 into a first part DLa and a second part DLb. At least one break position B exists between a first portion 131 and at least one second portion 132 of a conductive pattern 130 of each pixel structure PX1, PX2, or PX3, so that the plurality of first portions 131, which are electrically connected to one another, of the plurality of conductive patterns 130 of the plurality of pixel structures PX1, PX2, and PX3 can be used as a first alternative line. At least one break position B exists between a first portion 131 and at least one second portion 132 of a conductive pattern 130 of each pixel structure PX4, PX5, or PX6, so that the plurality of first portions 131, which are electrically connected to one another, of the plurality of conductive patterns 130 of the plurality of pixel structures PX4, PX5, and PX6 can be used as a second alternative line. For example, in the present embodiment, a laser beam with high energy may be used to form a break position B, but the invention is not limited thereto.

A connection point P exists between the first part DLa of the data line DL of the pixel structure PX4 and the first portion 131 of the conductive pattern 130 of the pixel structure PX1. A connection point P exists between the first portion 131 of the conductive pattern 130 of the pixel structure PX3 and the patching line rl. A connection point P exists between the first portion 131 of the conductive pattern 130 of the pixel structure PX6 and the patching line rl. In addition, a connection point P exists between the second part DLb of the data line DL of the pixel structure PX4 and the first portion 131 of the conductive pattern 130 of the pixel structure PX4. For example, in the present embodiment, the foregoing plurality of connection points P may be formed through a laser welding process, but the invention is not limited thereto.

In the embodiment of FIG. 4, based on the connection point P between the first part DLa of the data line DL of the pixel structure PX4 and the first portion 131 of the conductive pattern 130 of the pixel structure PX1, the first alternative line formed by the plurality of first portions 131 of the plurality of conductive patterns 130 of the pixel structures PX1, PX2, and PX3, the connection point P between the first portion 131 of the conductive pattern 130 of the pixel structure PX3 and the patching line rl, the part of the patching line rl that overlaps the pixel structures PX3 and PX6, the connection point P between the first portion 131 of the conductive pattern 130 of the pixel structure PX6 and the patching line rl, the second alternative line formed by the plurality of first portions 131 of the plurality of conductive patterns 130 of the pixel structures PX6, PX5, and PX4, and the connection point P between the first portion 131 of the conductive pattern 130 of the pixel structure PX4 and the second part DLb of the data line DL of the pixel structure PX4, the first part DLa and the second part DLb of the data line DL of the pixel structure PX4 that are originally broken by the opening O can be electrically connected, so that the pixel array substrate 100-1 can operate normally.

Figure 5:
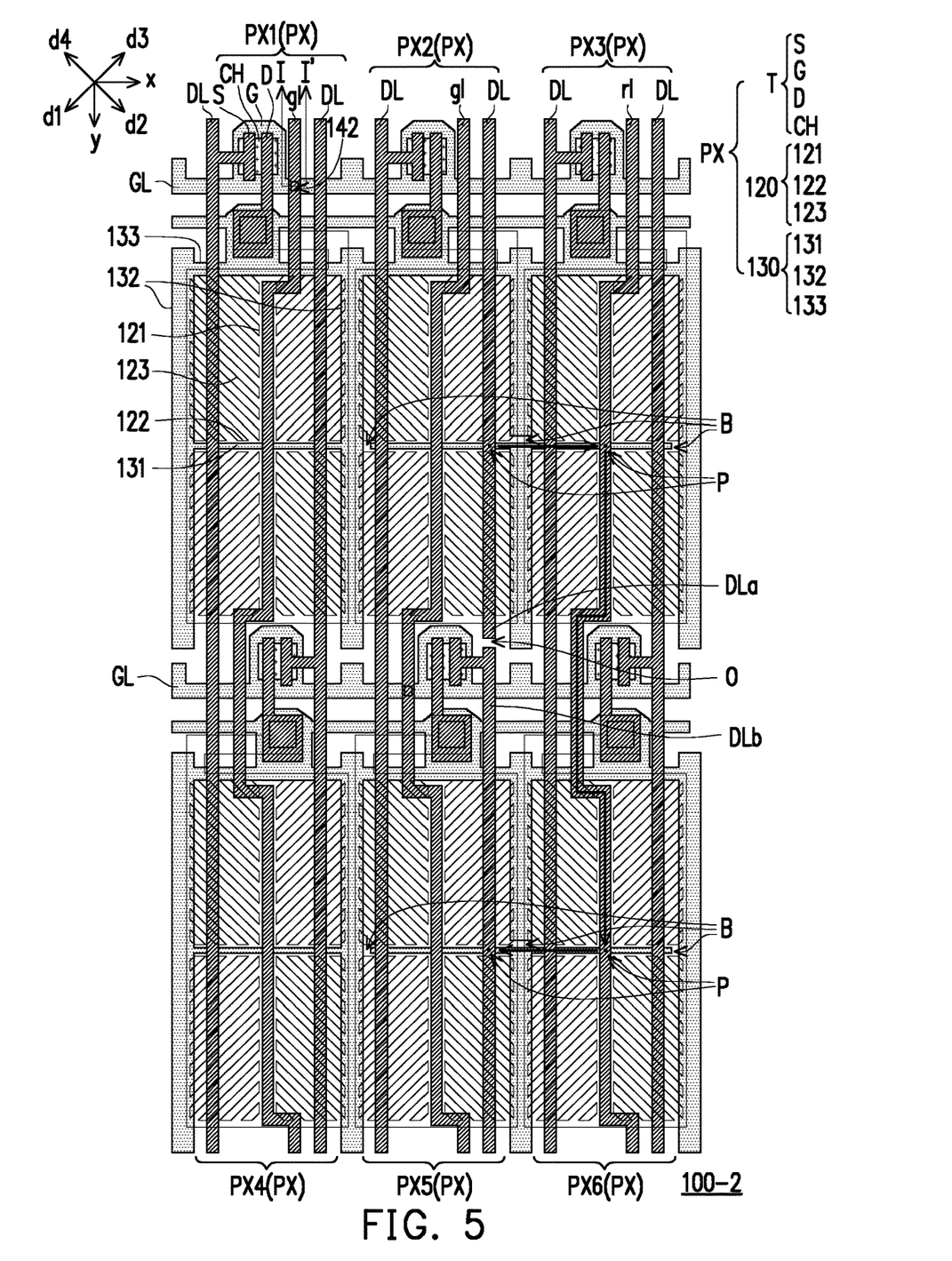
FIG. 5 shows a patched pixel array substrate 100-2 according to another embodiment of the invention.

FIG. 5 shows a patched pixel array substrate 100-2 according to another embodiment of the invention. The pixel array substrate 100-2 in FIG. 5 is similar to the pixel array substrate 100 in FIG. 2, and a difference between the two lies in that: a data line DL of a pixel structure PX5 in FIG. 5 has an opening O, that is, a defect, and the defect is patched.

Referring to FIG. 5, specifically, in the present embodiment, the data line DL of the pixel structure PX5 has the opening O (that is, a defect position), and the opening O divides the data line DL of the pixel structure PX5 into a first part DLa and a second part DLb. At least one break position B exists between a first portion 131 and at least one second portion 132 of a conductive pattern 130 of each pixel structure PX2 or PX3, so that the plurality of first portions 131, which are electrically connected to one another, of the plurality of conductive patterns 130 of the plurality of pixel structures PX2, and PX3 can be used as a first alternative line. At least one break position B exists between a first portion 131 and at least one second portion 132 of a conductive pattern 130 of each pixel structure PX6 or PX5, so that the plurality of first portions 131, which are electrically connected to one another, of the plurality of conductive patterns 130 of the plurality of pixel structures PX6 and PX5 can be used as a second alternative line.

A connection point P exists between the first part DLa of the data line DL of the pixel structure PX5 and the first portion 131 of the conductive pattern 130 of the pixel structure PX2. A connection point P exists between the first portion 131 of the conductive pattern 130 of the pixel structure PX3 and the patching line rl. A connection point P exists between the first portion 131 of the conductive pattern 130 of the pixel structure PX6 and the patching line rl. In addition, a connection point P exists between the second part DLb of the data line DL of the pixel structure PX5 and the first portion 131 of the conductive pattern 130 of the pixel structure PX5.

In the embodiment of FIG. 5, based on the connection point P between the first part DLa of the data line DL of the pixel structure PX5 and the first portion 131 of the conductive pattern 130 of the pixel structure PX2, the first alternative line formed by the plurality of first portions 131 of the plurality of conductive patterns 130 of the pixel structures PX2 and PX3, the connection point P between the first portion 131 of the conductive pattern 130 of the pixel structure PX3 and the patching line rl, the part of the patching line rl that overlaps the pixel structures PX3 and PX6, the connection point P between the first portion 131 of the conductive pattern 130 of the pixel structure PX6 and the patching line rl, the second alternative line formed by the plurality of first portions 131 of the plurality of conductive patterns 130 of the pixel structures PX6 and PX5, and the connection point P between the first portion 131 of the conductive pattern 130 of the pixel structure PX5 and the second part DLb of the data line DL of the pixel structure PX5, the first part DLa and the second part DLb of the data line DL of the pixel structure PX5 that are originally broken by the opening O can be electrically connected, so that the pixel array substrate 100-2 can operate normally.

Figure 6:
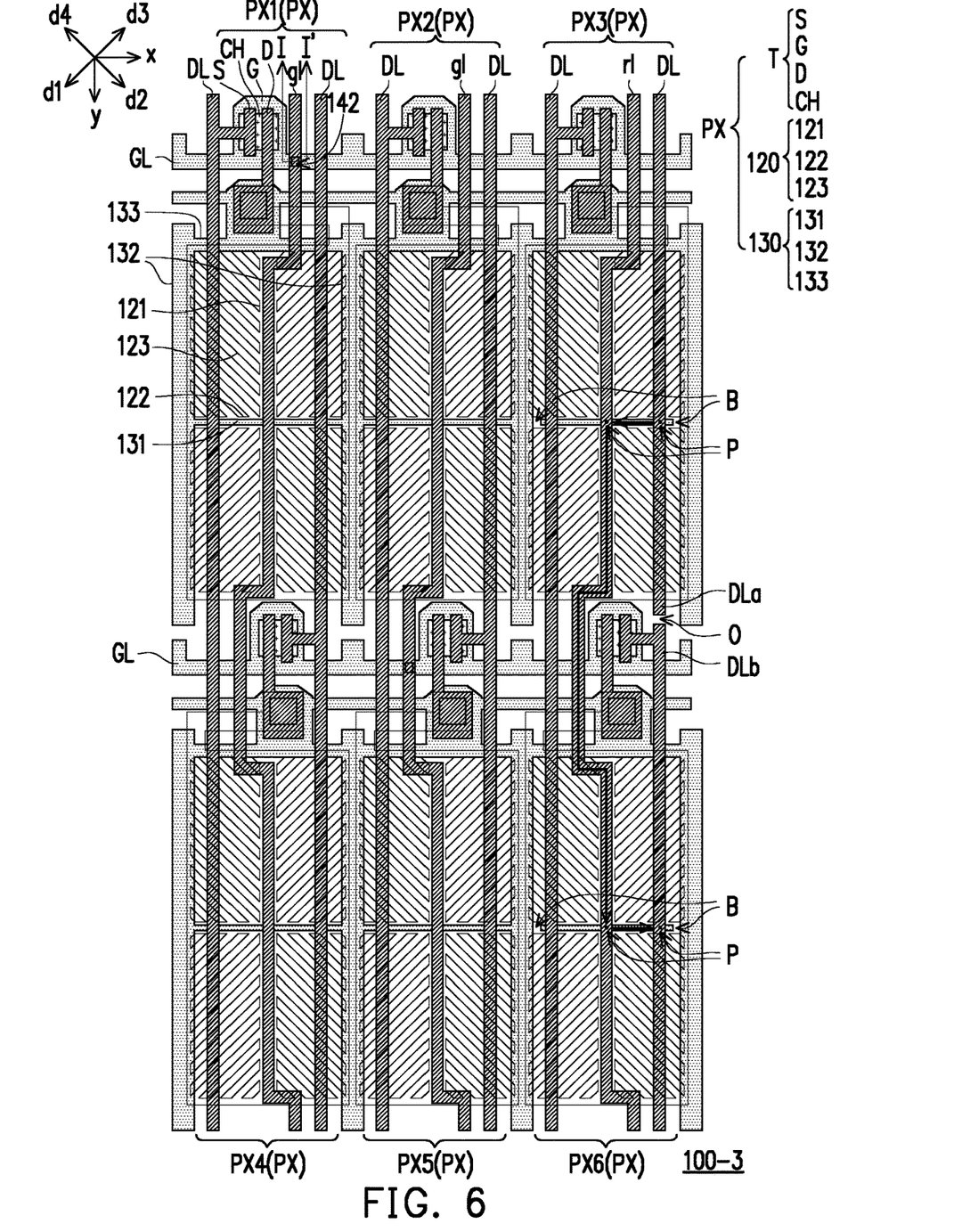
FIG. 6 shows a patched pixel array substrate 100-3 according to still another embodiment of the invention.

FIG. 6 shows a patched pixel array substrate 100-3 according to still another embodiment of the invention. The pixel array substrate 100-3 in FIG. 6 is similar to the pixel array substrate 100 in FIG. 2, and a difference between the two lies in that: a data line DL of a pixel structure PX6 in FIG. 6 has an opening O, that is, a defect, and the defect is patched.

Referring to FIG. 6, specifically, in the embodiment of FIG. 6, the data line DL of the pixel structure PX6 has the opening O (that is, a defect position), and the opening O divides the data line DL of the pixel structure PX6 into a first part DLa and a second part DLb. At least one break position B exists between a first portion 131 and at least one second portion 132 of a conductive pattern 130 of the pixel structure PX3, so that the first portion 131 of the conductive pattern 130 of the pixel structure PX3 can be used as a first alternative line. At least one break position B exists between a first portion 131 and at least one second portion 132 of a conductive pattern 130 of the pixel structure PX6, so that the first portion 13 of the conductive pattern 130 of the pixel structure PX6 can be used as a second alternative line.

A connection point P exists between the first part DLa of the data line DL of the pixel structure PX6 and the first portion 131 of the conductive pattern 130 of the pixel structure PX3. A connection point P exists between the first portion 131 of the conductive pattern 130 of the pixel structure PX3 and the patching line rl. A connection point P exists between the first portion 131 of the conductive pattern 130 of the pixel structure PX6 and the patching line rl. In addition, a connection point P exists between the second part DLb of the data line DL of the pixel structure PX6 and the first portion 131 of the conductive pattern 130 of the pixel structure PX6.

In the embodiment of FIG. 6, based on the connection point P between the first part DLa of the data line DL of the pixel structure PX6 and the first portion 131 of the conductive pattern 130 of the pixel structure PX3, the first alternative line formed by the first portion 131 of the conductive pattern 130 of the pixel structure PX3, the connection point P between the first portion 131 of the conductive pattern 130 of the pixel structure PX3 and the patching line rl, the part of the patching line rl that overlaps the pixel structures PX3 and PX6, the connection point P between the first portion 131 of the conductive pattern 130 of the pixel structure PX6 and the patching line rl, the second alternative line formed by the first portion 131 of the conductive pattern 130 of the pixel structure PX6, and the connection point P between the first portion 131 of the conductive pattern 130 of the pixel structure PX6 and the second part DLb of the data line DL of the pixel structure PX6, the first part DLa and the second part DLb of the data line DL of the pixel structure PX6 that are originally broken by the opening O can be electrically connected, so that the pixel array substrate 100-3 can operate normally.

Referring to FIG. 4, FIG. 5, and FIG. 6, in the patched pixel array substrates 100-1, 100-2, and 100-3, the pixel structure PX whose first portion 131 is used for patching uses the second portion 132 and the third portion 133 of the conductive pattern 130 as a common electrode. The second portion 132 and the third portion 133 of the pixel structure PX whose first portion 131 is used for patching are separate from the patching line rl in structure, and the patching line rl has a potential different from those of the second portion 132 and the third portion 133.

Figure 7:
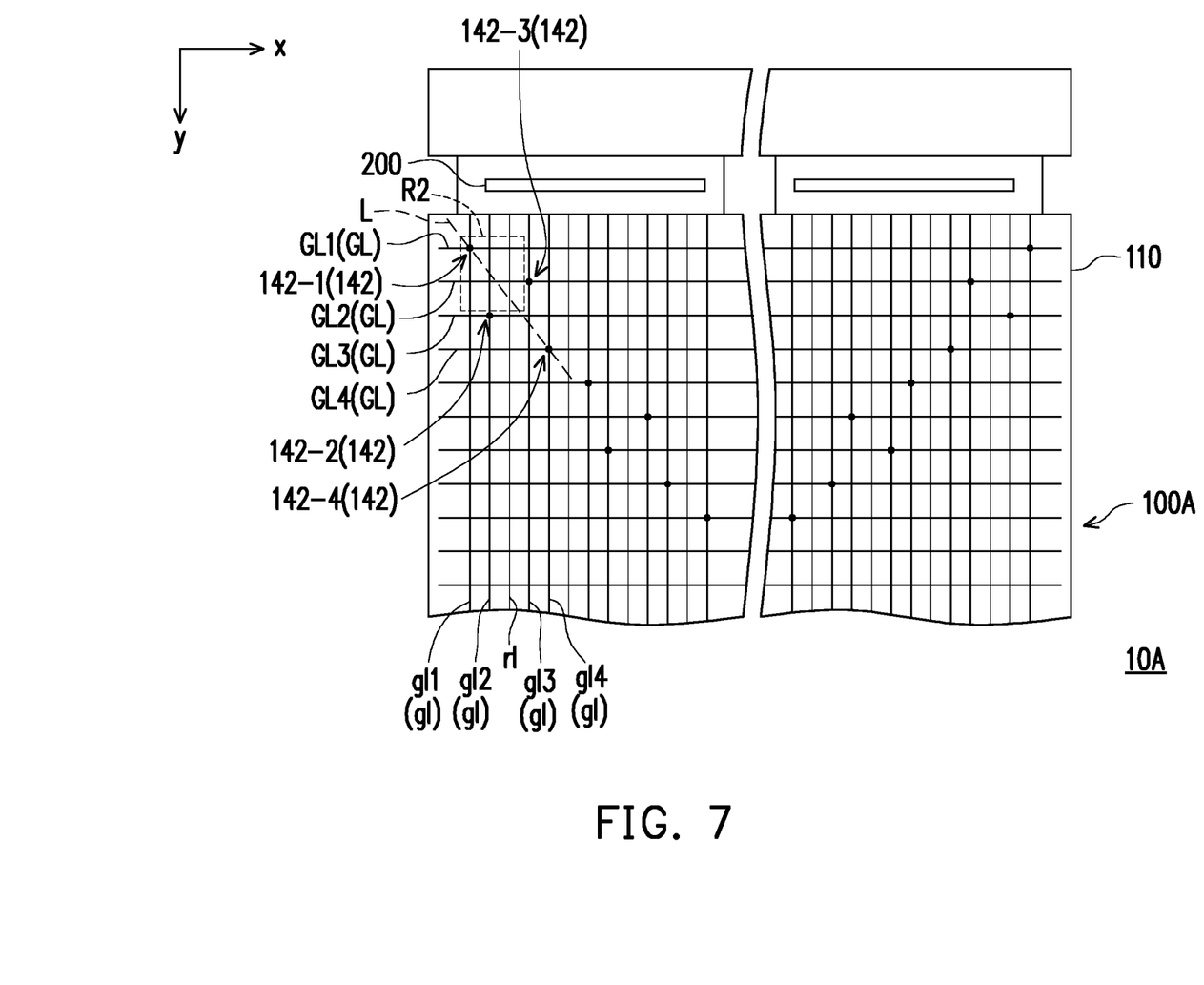
FIG. 7 is a schematic top view of a display device 10A according to another embodiment of the invention.

FIG. 7 is a schematic top view of a display apparatus 10A according to another embodiment of the invention. FIG. 7 shows a pixel array substrate 100A and a driver element 200, and other components of the display device 10A are omitted.

Figure 8:
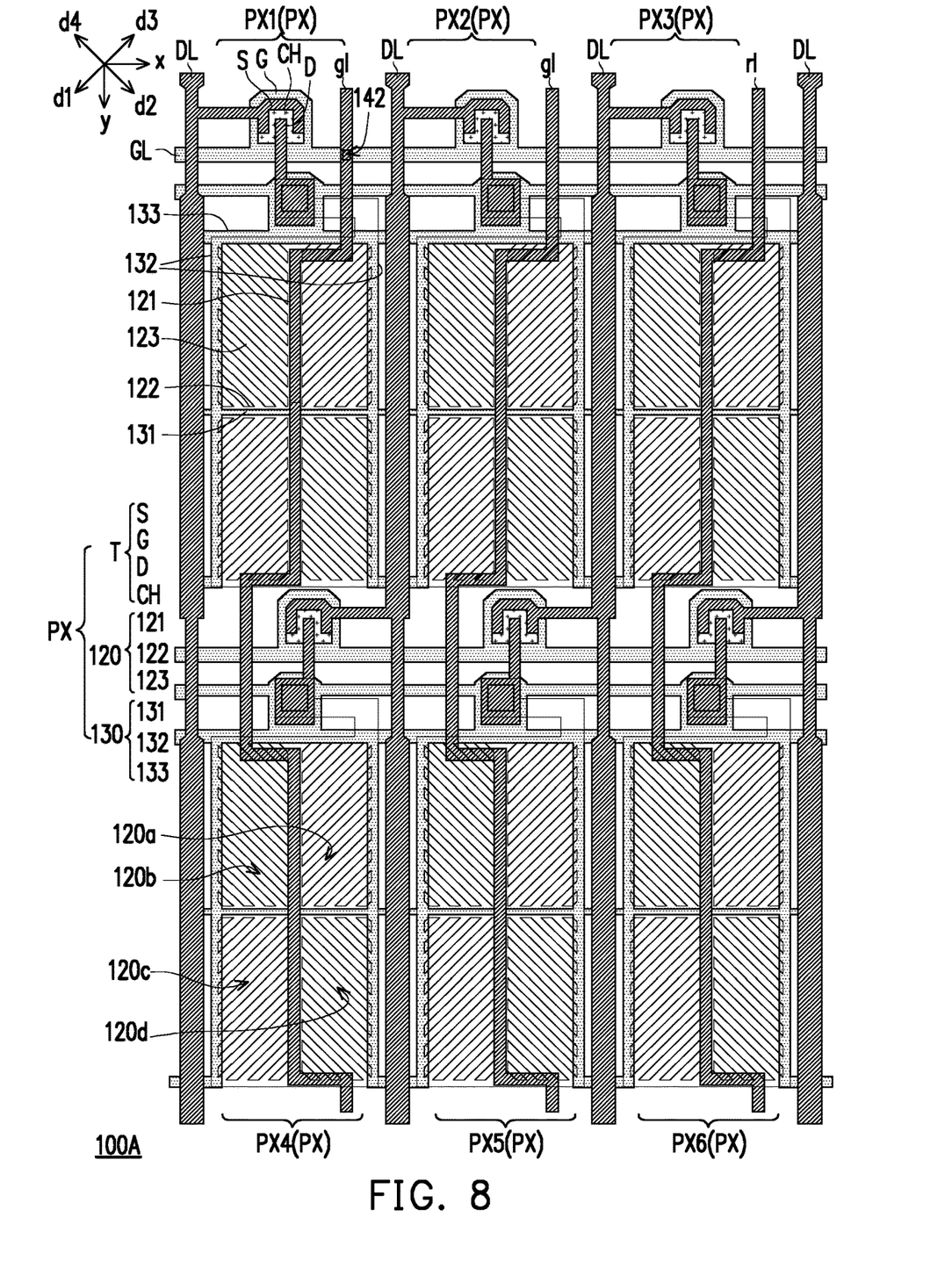
FIG. 8 is a schematic top view of a pixel array substrate 100A according to an embodiment of the invention.

FIG. 8 is a schematic top view of a pixel array substrate 100A according to an embodiment of the invention. FIG. 8 corresponds to a part R2 in FIG. 7.

A plurality of data lines DL, a plurality of active devices T, a plurality of pixel electrodes 120, and a plurality of conductive patterns 130 in FIG. 8 are omitted in FIG. 7, and a substrate 110 in FIG. 7 is omitted in FIG. 8.

The display device 10A in FIG. 7 and the pixel array substrate 100A in FIG. 8 are similar to the display device 10 in FIG. 1 and the pixel array substrate 100 in FIG. 2, and differences thereof are described as follows.

In the embodiment of FIG. 2, two adjacent gate lines GL may both have gate-on potentials, that is, the pixel array substrate 100 in FIG. 2 may be driven in a manner of two data lines and half gate line (2DhG). In the embodiment of FIG. 9, two adjacent gate lines GL may both have gate-on potentials, that is, the pixel array substrate 100A in FIG. 9 may be driven in a manner of one data line and one gate line (1D1G). In a word, the pixel array substrates 100, 100-1, 100-2, 100-3, and 100A in the embodiments of the invention may be driven in any suitable manner, which is not limited in the invention.

In the embodiments of FIG. 1 and FIG. 8, the plurality of transfer lines gl include the first transfer line gl1, the second transfer line gl2, the third transfer line gl3, and the fourth transfer line gl4 that are sequentially arranged in the first direction x, and the plurality of gate lines GL include the first gate line GL1, the second gate line GL2, the third gate line GL3, and the fourth gate line GL4 that are sequentially arranged in the second direction y. The first transfer line gl1, the second transfer line gl2, the third transfer line gl3, and the fourth transfer line gl4 are electrically connected to the first gate line GL1, the second gate line GL2, the third gate line GL3, and the fourth gate line GL4 through the first contact window 142-1, the second contact window 142-2, the third contact window 142-3, and the fourth contact window 142-4 of the insulation layer 140 (shown in FIG. 3).

In the embodiment of FIG. 1, the connecting line L exists between the first contact window 142-1 and the fourth contact window 142-4, and the second contact window 142-2 and the third contact window 142-3 are essentially located on the connecting line L. In the embodiment of FIG. 8, the connecting line L exists between the first contact window 142-1 and the fourth contact window 142-4, but the second contact window 142-2 and the third contact window 142-3 are obviously located on two opposite sides of the connecting line L respectively. In other words, the first contact window 142-1, the second contact window 142-2, the third contact window 142-3, and the fourth contact window 142-4 in FIG. 8 are scattered. Therefore, the disposition of the plurality of contact windows 142 of the pixel array substrate 100A is not easily detected by human eyes, so that a visual effect of the display device 10A can be improved.

For example, in the embodiment of FIG. 8, the first transfer line gl1 is electrically connected to the first gate line GL1 through the first contact window 142-1 of the insulation layer 140, the second transfer line gl2 is electrically connected to the third gate line GL3 through the second contact window 142-2 of the insulation layer 140, the third transfer line gl3 is electrically connected to the second gate line GL2 through the third contact window 142-3 of the insulation layer 140, and the fourth transfer line gl4 is electrically connected to the fourth gate line GL through the fourth contact window 142-44 of the insulation layer 140, but the invention is not limited thereto.

When broken, the data line DL of the pixel array substrate 100A in FIG. 7 may be patched in a manner similar to that for patching the pixel array substrate 100-1 in FIG. 4, or that for patching the pixel array substrate 100-2 in FIG. 5, and/or that for patching the pixel array substrate 100-3 in FIG. 6. Such a manner may be achieved by one of ordinary skills in the art according to the foregoing descriptions, and details thereof are not described herein.

What is claimed is:
1. A pixel array substrate, comprising:
a substrate;
a plurality of pixel structures, disposed on the substrate, wherein each of the pixel structures comprises a data line, a gate line, an active device, and a pixel electrode, the active device is electrically connected to the data line and the gate line, the pixel electrode is electrically connected to the active device, the pixel electrode defines a plurality of alignment domains, and the alignment domains comprise a plurality of different alignment directions; and a plurality of transfer lines, wherein the transfer lines are arranged in a first direction, a plurality of gate lines of the pixel structures are arranged in a second direction, the first direction and the second direction are interlaced, and the transfer lines are electrically connected to the gate lines, and the pixel structures comprise a first pixel structure, the transfer lines comprise a first transfer line, and the first transfer line overlaps a boundary between the alignment domains of the first pixel structure.

2. The pixel array substrate according to claim 1, wherein the pixel electrode of each of the pixel structures comprises a first trunk portion and a plurality of branch portions, and the first trunk portion extends in the second direction; the branch portions are respectively located on two opposite sides of the first trunk portion and extend toward different directions; and the first transfer line overlaps the first trunk portion of the pixel electrode of the first pixel structure.

3. The pixel array substrate according to claim 1, wherein each of the pixel structures further comprises a conductive pattern, the conductive pattern partially overlaps the pixel electrode, at least one part of the conductive pattern is a common electrode, and the pixel array substrate further comprises:

a patching line, disposed on the substrate and separated from the common electrode in structure, wherein the pixel structures further comprise a second pixel structure, and the patching line overlaps a boundary between the alignment domains of the second pixel structure.

4. The pixel array substrate according to claim 3, wherein the pixel electrode of each of the pixel structures comprises a first trunk portion and a plurality of branch portions, and the first trunk portion extends in the second direction; the branch portions are respectively located on two opposite sides of the first trunk portion and extend toward different directions; and the patching line overlaps the first trunk portion of the pixel electrode of the second pixel structure.

5. The pixel array substrate according to claim 3, wherein the conductive pattern of each of the pixel structures comprises a first portion extending in the first direction and at least one second portion extending in the second direction; and the first portion of the conductive pattern of the second pixel structure and the patching line are interlaced.

6. The pixel array substrate according to claim 5, wherein the pixel electrode of each of the pixel structures comprises a first trunk portion and a second trunk portion interlaced with each other; and an intersection between the first portion of the conductive pattern of the second pixel structure and the patching line overlaps an intersection between the first trunk portion and the second trunk portion of the second pixel structure.

7. The pixel array substrate according to claim 3, wherein the pixel structures further comprise a third pixel structure, the first pixel structure and the second pixel structure are arranged in the first direction, and the second pixel structure and the third pixel structure are arranged in the second direction; and at least one break position exists between the first portion and the at least one second portion of the conductive pattern of the second pixel structure, a connection point exists between the first portion of the conductive pattern of the second pixel structure and the patching line, at least one break position exists between the first portion and the at least one second portion of the conductive pattern of the third pixel structure, and a connection point exists between the first portion of the conductive pattern of the third pixel structure and the patching line.

8. The pixel array substrate according to claim 7, wherein the pixel structures further comprise a fourth pixel structure, the first pixel structure and the fourth pixel structure are arranged in the second direction, and the third pixel structure and the fourth pixel structure are arranged in the first direction; the data line of the fourth pixel structure comprises an opening, and the data line of the fourth pixel structure is divided into a first part and a second part by the opening; at least one break position exists between the first portion and the at least one second portion of the conductive pattern of the first pixel structure; a connection point exists between the first part of the data line of the fourth pixel structure and the first portion of the conductive pattern of the first pixel structure; the first portion of the conductive pattern of the first pixel structure is electrically connected to the first portion of the conductive pattern of the second pixel structure; the first portion of the conductive pattern of the third pixel structure is electrically connected to the first portion of the conductive pattern of the fourth pixel structure; and at least one break position exists between the first portion and the at least one second portion of the conductive pattern of the fourth pixel structure, and a connection point exists between the second part of the data line of the fourth pixel structure and the first portion of the conductive pattern of the fourth pixel structure.

9. The pixel array substrate according to claim 7, wherein the data line of the third pixel structure comprises an opening, and the data line of the third pixel structure is divided into a first part and a second part by the opening; and a connection point exists between the first part of the data line of the third pixel structure and the first portion of the conductive pattern of the second pixel structure, and a connection point exists between the second part of the data line of the third pixel structure and the first portion of the conductive pattern of the third pixel structure.

10. The pixel array substrate according to claim 1, wherein the transfer lines comprise a first transfer line, a second transfer line, a third transfer line, and a fourth transfer line sequentially arranged in the first direction, and the pixel array substrate further comprises:

an insulation layer, disposed between the transfer lines and the gate lines, wherein the first transfer line, the second transfer line, the third transfer line, and the fourth transfer line are electrically connected to the gate lines respectively through a first contact window, a second contact window, a third contact window, and a fourth contact window of the insulation layer, and the second contact window and the third contact window are respectively located on two opposite sides of a connecting line between the first contact window and the fourth contact window.

11. The pixel array substrate according to claim 1, wherein the transfer lines comprise a first transfer line, a second transfer line, a third transfer line, and a fourth transfer line sequentially arranged in the first direction, the gate lines comprise a first gate line, a second gate line, a third gate line, and a fourth gate line sequentially arranged in the second direction, and the pixel array substrate further comprises:

an insulation layer, disposed between the transfer lines and the gate lines, wherein the first transfer line is electrically connected to the first gate line through a first contact window of the insulation layer, the second transfer line is electrically connected to the third gate line through a second contact window of the insulation layer, the third transfer line is electrically connected to the second gate line through a third contact window of the insulation layer, and the fourth transfer line is electrically connected to the fourth gate line through a fourth contact window of the insulation layer.

12. A pixel array substrate, comprising:
a substrate;
a plurality of pixel structures, disposed on the substrate, wherein each of the pixel structures comprises a data line, a gate line, an active device, a pixel electrode, and a conductive pattern, the active device is electrically connected to the data line and the gate line, the pixel electrode is electrically connected to the active device, the pixel electrode defines a plurality of alignment domains, the alignment domains comprise a plurality of different alignment directions, the conductive pattern partially overlaps the pixel electrode, and at least one part of the conductive pattern is a common electrode;
a plurality of transfer lines, wherein the transfer lines are arranged in a first direction, a plurality of gate lines of the pixel structures are arranged in a second direction, the first direction and the second direction are interlaced, and the transfer lines are electrically connected to the gate lines; and
a patching line, disposed on the substrate and separated from the common electrode in structure, wherein the pixel structures comprise a first pixel structure and the patching line overlaps a boundary between the alignment domains of the first pixel structure.

13. The pixel array substrate according to claim 12, wherein the pixel electrode of each of the pixel structures comprises a first trunk portion and a plurality of branch portions, and the first trunk portion extends in the second direction; the branch portions are respectively located on two opposite sides of the first trunk portion and extend toward different directions; and the patching line overlaps the first trunk portion of the pixel electrode of the first pixel structure.

14. The pixel array substrate according to claim 12, wherein the conductive pattern of each of the pixel structures comprises a first portion extending in the first direction and at least one second portion extending in the second direction; and the first portion of the conductive pattern of the first pixel structure and the patching line are interlaced.

15. The pixel array substrate according to claim 14, wherein the pixel electrode of each of the pixel structures comprises a first trunk portion and a second trunk portion interlaced with each other; and an intersection between the first portion of the conductive pattern of the first pixel structure and the patching line overlaps an intersection between the first trunk portion and the second trunk portion of the first pixel structure.

16. The pixel array substrate according to claim 14, wherein the pixel structures comprise a second pixel structure, and the first pixel structure and the second pixel structure are arranged in the second direction; at least one break position exists between the first portion and the at least one second portion of the conductive pattern of the first pixel structure, and a connection point exists between the first portion of the conductive pattern of the first pixel structure and the patching line; and at least one break position exists between the first portion and the at least one second portion of the conductive pattern of the second pixel structure, and a connection point exists between the first portion of the conductive pattern of the second pixel structure and the patching line.

17. The pixel array substrate according to claim 16, wherein the pixel structures further comprise a third pixel structure and a fourth pixel structure, the second pixel structure and the third pixel structure are arranged in the first direction, the third pixel structure and the fourth pixel structure are arranged in the second direction, and the first pixel structure and the fourth pixel structure are arranged in the first direction; the data line of the third pixel structure comprises an opening, and the data line of the third pixel structure is divided into a first part and a second part by the opening; at least one break position exists between the first portion and the at least one second portion of the conductive pattern of the fourth pixel structure, and a connection point exists between the first part of the data line of the third pixel structure and the first portion of the conductive pattern of the fourth pixel structure; the first portion of the conductive pattern of the fourth pixel structure is electrically connected to the first portion of the conductive pattern of the first pixel structure; the first portion of the conductive pattern of the second pixel structure is electrically connected to the first portion of the conductive pattern of the third pixel structure; and at least one break position exists between the first portion and the at least one second portion of the conductive pattern of the third pixel structure, and a connection point exists between the second part of the data line of the third pixel structure and the first portion of the conductive pattern of the third pixel structure.

18. The pixel array substrate according to claim 16, wherein the data line of the second pixel structure comprises an opening, and the data line of the second pixel structure is divided into a first part and a second part by the opening; a connection point exists between the first part of the data line of the second pixel structure and the first portion of the conductive pattern of the first pixel structure; and a connection point exists between the first portion of the conductive pattern of the second pixel structure and the second portion of the data line of the second pixel structure.

19. The pixel array substrate according to claim 12, wherein the transfer lines comprise a first transfer line, a second transfer line, a third transfer line, and a fourth transfer line sequentially arranged in the first direction, and the pixel array substrate further comprises:
an insulation layer, disposed between the transfer lines and the gate lines, wherein the first transfer line, the second transfer line, the third transfer line, and the fourth transfer line are electrically connected to the gate lines respectively through a first contact window, a second contact window, a third contact window, and a fourth contact window of the insulation layer, and the second contact window and the third contact window are respectively located on two opposite sides of a connecting line between the first contact window and the fourth contact window.

20. The pixel array substrate according to claim 12, wherein the transfer lines comprise a first transfer line, a second transfer line, a third transfer line, and a fourth transfer line sequentially arranged in the first direction, the gate lines comprise a first gate line, a second gate line, a third gate line, and a fourth gate line sequentially arranged in the second direction, and the pixel array substrate further comprises:
an insulation layer, disposed between the transfer lines and the gate lines, wherein the first transfer line is electrically connected to the first gate line through a first contact window of the insulation layer, the second transfer line is electrically connected to the third gate line through a second contact window of the insulation layer, the third transfer line is electrically connected to the second gate line through a third contact window of the insulation layer, and the fourth transfer line is electrically connected to the fourth gate line through a fourth contact window of the insulation layer.

\* \* \* \* \*